United States Patent [19]
Kohno et al.

[11] Patent Number: 5,347,429
[45] Date of Patent: Sep. 13, 1994

[54] PLASTIC-MOLDED-TYPE SEMICONDUCTOR DEVICE

[75] Inventors: Ryuji Kohno, Ibaraki; Asao Nishimura, Ushiku; Makoto Kitano, Tsuchiura; Akihiro Yaguchi; Nae Yoneda, both of Ibaraki, all of Japan

[73] Assignee: Hitachi, Ltd., Tokyo, Japan

[21] Appl. No.: 68,319

[22] Filed: May 28, 1993

Related U.S. Application Data

[63] Continuation of Ser. No. 791,194, Nov. 13, 1991, abandoned.

[30] Foreign Application Priority Data

Nov. 14, 1990 [JP] Japan .................. 2-308208

[51] Int. Cl.⁵ ................................ H05K 5/02
[52] U.S. Cl. .................... 361/813; 174/52.4; 257/666; 257/777
[58] Field of Search ........... 174/52.1, 52.2, 52.3, 174/52.4; 257/666, 668, 777, 723, 724; 361/813; 228/180.2; 439/68, 70

[56] References Cited

U.S. PATENT DOCUMENTS

| 4,722,027 | 1/1988 | Hayakawa | 361/400 |
|---|---|---|---|
| 5,012,323 | 4/1991 | Farnworth | 257/723 |

FOREIGN PATENT DOCUMENTS

| 0284820 | 10/1988 | European Pat. Off. | 439/68 |
|---|---|---|---|
| 53-39891 | 12/1978 | Japan | 257/666 |
| 54-144872 | 11/1979 | Japan | 257/666 |
| 58-130553 | 8/1983 | Japan | 257/723 |
| 63-152160 | 6/1988 | Japan | 257/666 |
| 2-201942 | 8/1990 | Japan | 257/777 |
| 3-109760 | 5/1991 | Japan | 257/777 |
| 3-261153 | 11/1991 | Japan | 257/668 |

Primary Examiner—Leo P. Picard
Assistant Examiner—Donald A. Sparks
Attorney, Agent, or Firm—Antonelli, Terry, Stout & Kraus

[57] ABSTRACT

A plastic-molded-type semiconductor device includes a plurality of semiconductor chips, metallic wires connected to the semiconductor chips, leads connected to the metallic wires, and an insulating member interposed between the semiconductor chips and sealed in a resin member. Circuit formed surfaces of the semiconductor chips are directed in the same direction, and one or more of the semiconductor chips serve as a base on which the other semiconductor chips are mounted through the insulating member. One ends of the leads are bonded to the insulating member, and electrodes pad of each semiconductor chip are not covered by the other semiconductor chips, the insulating member and the leads, and therefore are exposed to the surface of the insulating member. In this device, the provision of a tab is omitted, and the laminated chips can be contained in a package thinner than a conventional package. Since the circuit formation surfaces of all of the chips are directed in the same direction, all of the electrical connections can be made by wire bonding from one direction.

10 Claims, 5 Drawing Sheets

PLASTIC-MOLDED-TYPE SEMICONDUCTOR DEVICE

This application is a continuation application of Ser. No. 07/791,194 filed Nov. 13, 1991, which is now abandoned.

BACKGROUND OF THE INVENTION

1. Field of the Invention

This invention relates generally to a semiconductor, and more particularly to a plastic-molded-type semiconductor device in which a plurality of semiconductor chips are sealed or molded in a single resin so as to achieve a compact construction.

2. Description of the Prior Art

Conventional plastic-molded-type (resin-sealed type) semiconductor devices each having a plurality of semiconductor chips sealed in a single resin are disclosed in the following publications:

Japanese Patent Unexamined Publication No. 1-295454 discloses an example in which circuit formation surfaces of two semiconductor chips face each other, and electrode pads of the two chips are directly joined to each other.

Japanese Patent Unexamined Publication No. 2-2658 discloses an example in which semiconductor chips are bonded respectively to front and rear sides or surfaces of a lead frame, and the semiconductor chips and leads are wire-bonded together from opposite directions.

Japanese Patent Unexamined Publication No. 2-15660 discloses a construction which is generally similar to that disclosed in the above Japanese Patent Unexamined Publication No. 1-295454 but differs therefrom in such a structure that a deformation-preventing resin is filled in between two semiconductor chips.

In Japanese Patent Unexamined Publication Nos. 1-295454 and 2-15660 among the above prior art, the production step of directly joining the electrode pads of the two semiconductor chips to each other is required, and there is encountered a problem that the product yield in this production step is low.

As regards Japanese Patent Unexamined Publication No. 2-2658, after the bonding of the semiconductor chip to one side of the lead frame, or after the wire bonding, the lead frame is inverted so as to effect the bonding at the other side. Therefore, the production process is complicated, and also there is a risk that the wires on the reverse surface may be damaged when the bonding at the opposite side is to be effected.

Further, in any of the above prior art publications, the semiconductor chip is adapted to be mounted on a plate member (which is called a "tab") provided on the lead frame. Therefore, the thickness of the semiconductor device is increased. As a result, when the semiconductor device is mounted on a substrate, a space available in the direction of the height is reduced, which prevents a high-density design. On the other hand, in order to make the thickness of the semiconductor device uniform, if the thickness of the resin is reduced, the resin is damaged under a high-temperature condition as when soldering the semiconductor device to the substrate, so that the sealing function of the resin is lowered, which adversely affects the reliability.

SUMMARY OF THE INVENTION

It is an object of this invention to provide a plastic-molded-type semiconductor device which can contain a plurality of semiconductor chips without increasing the size of the device, in order to have a large memory capacity or many functions as compared with the prior art device.

According to one aspect of the present invention, there is provided a plastic-molded-type semiconductor device wherein a plurality of semiconductor chips, metallic wires connected to the semiconductor chips, leads connected to the metallic wires, and an insulating member interposed between the semiconductor chips are sealed in a resin member; circuit formed surfaces of the semiconductor chips are directed in the same direction; one of the semiconductor chips serves as a base on which the other semiconductor chips are mounted through the insulating member; at least one end of each of the leads is bonded to a surface of the insulating member; and electrode pads of each of the semiconductor chips are exposed to the circuit formed surface thereof without enclosing them with other semiconductor chip, insulating member, lead or the like.

According to another aspect of the present invention, there is provided a plastic-molded-type semiconductor device wherein a plurality of semiconductor chips, metallic wires connected to the semiconductor chips, leads connected to the metallic wires, and an insulating member interposed between the semiconductor chips are sealed in a resin member; circuit formed surfaces of the semiconductor chips are directed in the same direction; some of the semiconductor chips serves as a base on which the Other semiconductor chips are mounted through the insulating member; at least one ends of the leads are bonded to a surface of the insulating member; and electrode pads of each of the semiconductor chips are exposed to the circuit formed surface thereof without covering them with other semiconductor chip, insulating member, lead or the like.

A notch can be formed in one end portion of the lead close to the semiconductor chip, and is disposed in the vicinity of the electrode pad.

A conductor pattern interconnecting the metallic wires and the leads can be formed on the surface of the insulating member.

The other semiconductor chips mounted on the semiconductor chip serving as the base can be connected to one another by electrically-conductive materials.

The plurality of semiconductor chips different in main function from one another can be mounted thereon in the above-mentioned manner.

With the above construction, one or more of the laminated semiconductor chips serving as the base perform the function of a conventional tab, and therefore the tab is not needed, and the semiconductor device is prevented from increasing in thickness thereof.

Further, since the electrode pads on the circuit formed surfaces of the semiconductor chips are directed in the same direction, and are exposed to all of these surfaces, the electrical connections of the semiconductor chips can be carried out by the wire bonding from one direction. Therefore, the step of inverting the lead frame is not needed, and the production process is simplified, and the reliability of the semiconductor chips as well as the reliability of the wires is enhanced.

Further, the notch, formed in the lead in the vicinity of the electrode pad, serves to increase the space in the vicinity of the electrode pad of the lower semiconductor chip, thereby enhancing the efficiency of the wire bonding operation.

DETAILED DESCRIPTION OF THE PREFERRED EMBODIMENTS

Preferred embodiments of the present invention will now be described with reference to the drawings.

Figure 1:
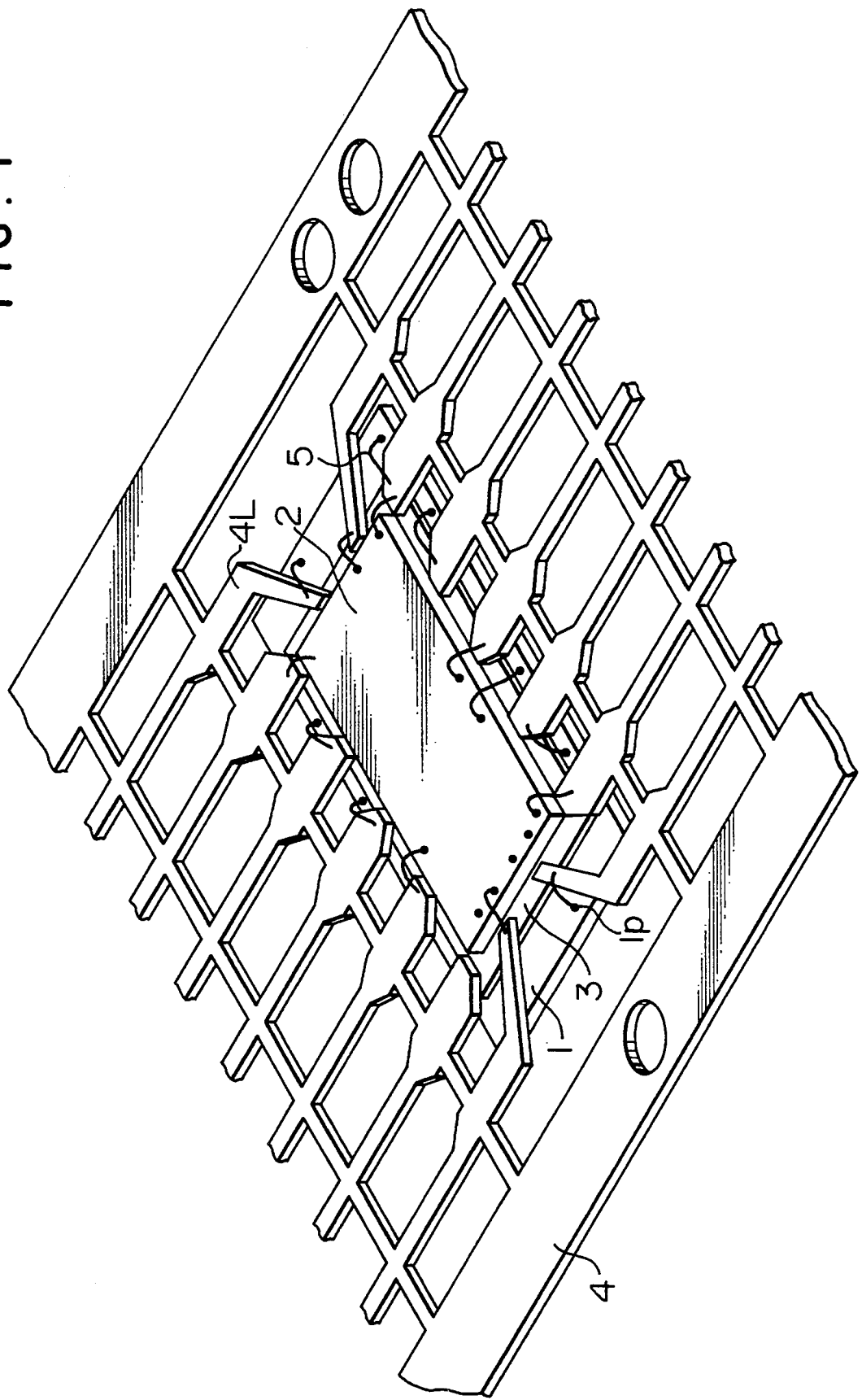
FIG. 1 is a perspective view of a semiconductor device according to a first embodiment of the present invention after a wire bonding operation is effected.

FIG. 1 shows a first embodiment of the present invention in the state immediately after a wire bonding step of a package production process. An insulating member 3 such as an insulating film is placed on a chip 1 serving as a base, and a lead frame 4 with no tab and a chip 2 are mounted on the insulating member 3. Then, the chips 1 and 2 and leads 4L are electrically connected together by wires 5. At this time, depending on the combination of connection, that is, the connection between the chip 1 and the leads 4L, the connection between the chip 2 and the leads 4L and the connection between the chip 1 and the chip 2, the two in each combination differ in height from each other, and therefore from the viewpoint of setting a program, the electrical connections of these three combinations should preferably be carried out separately from one another.

This example is effective particularly when it is desired to avoid the situation in which a large-capacity memory or the like is formed by a single chip in which case the area of the chip is unduly large with respect to the package area.

Figure 2:
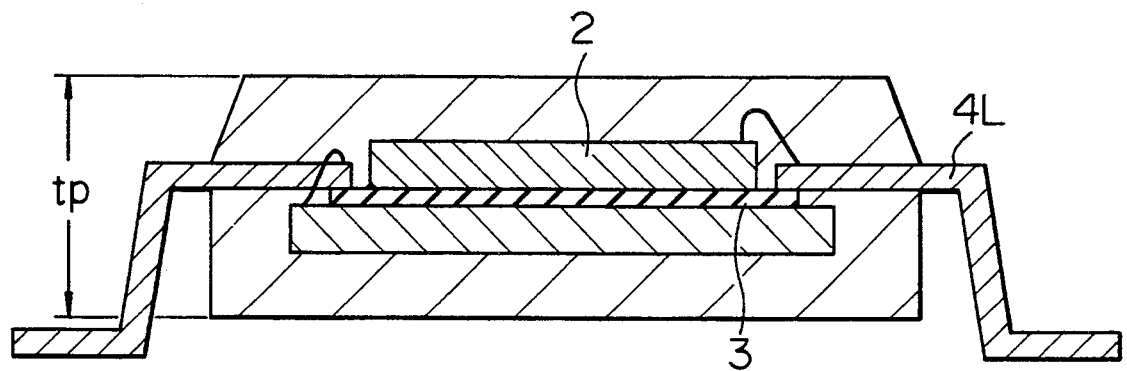
FIG. 2 is a vertical cross-sectional view of the semiconductor device of FIG. 1 after a molding is effected.

FIG. 2 is a cross-sectional view in a widthwise direction after the molding of the package in the first embodiment. As is clear from this Figure, according to the present invention, the leads 4L and the chip 2 are disposed in a common plane (that is, on the surface of the insulating member 3), and also the thickness of the lead 4L is smaller than that of the chip 2. Therefore, the overall thickness of the package is not increased, and the outer shape can be thinned as compared with that of a conventional package.

Figure 3:
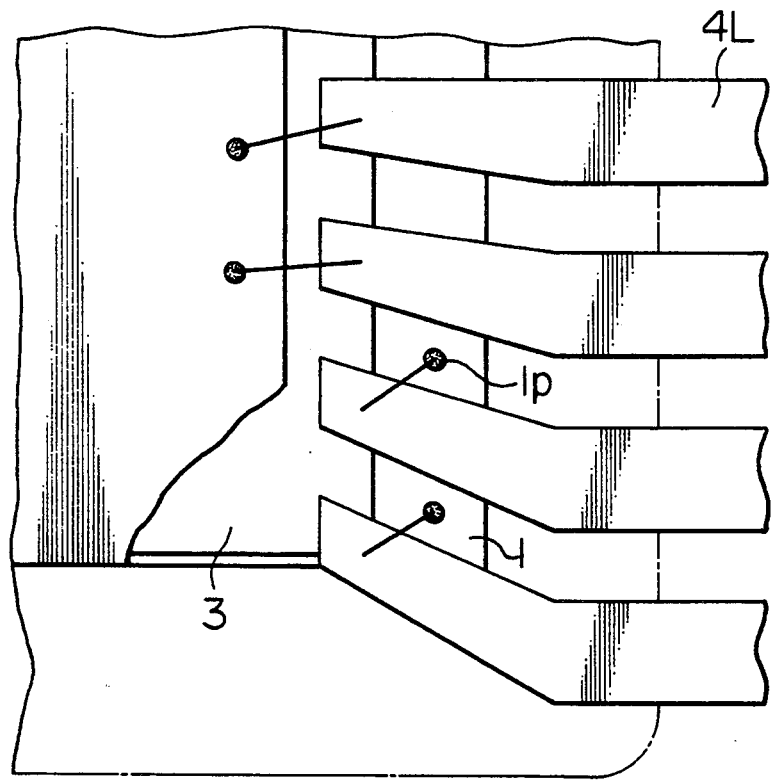
FIG. 3 is an enlarged plan view of an electrode pad portion of the semiconductor device of FIG. 1.

FIG. 3 is an enlarged plan view of an electrode pad portion of the chip of FIG. 1. Referring to this plan view, it is necessary that the shapes of the leads 4L and the insulating film 3, as well as the arrangement of electrode pads 1p, should be so determined that the leads 4L and the insulating film 3 will not cover the electrode pads 1p in the chip 1 serving as the base.

Figure 4:
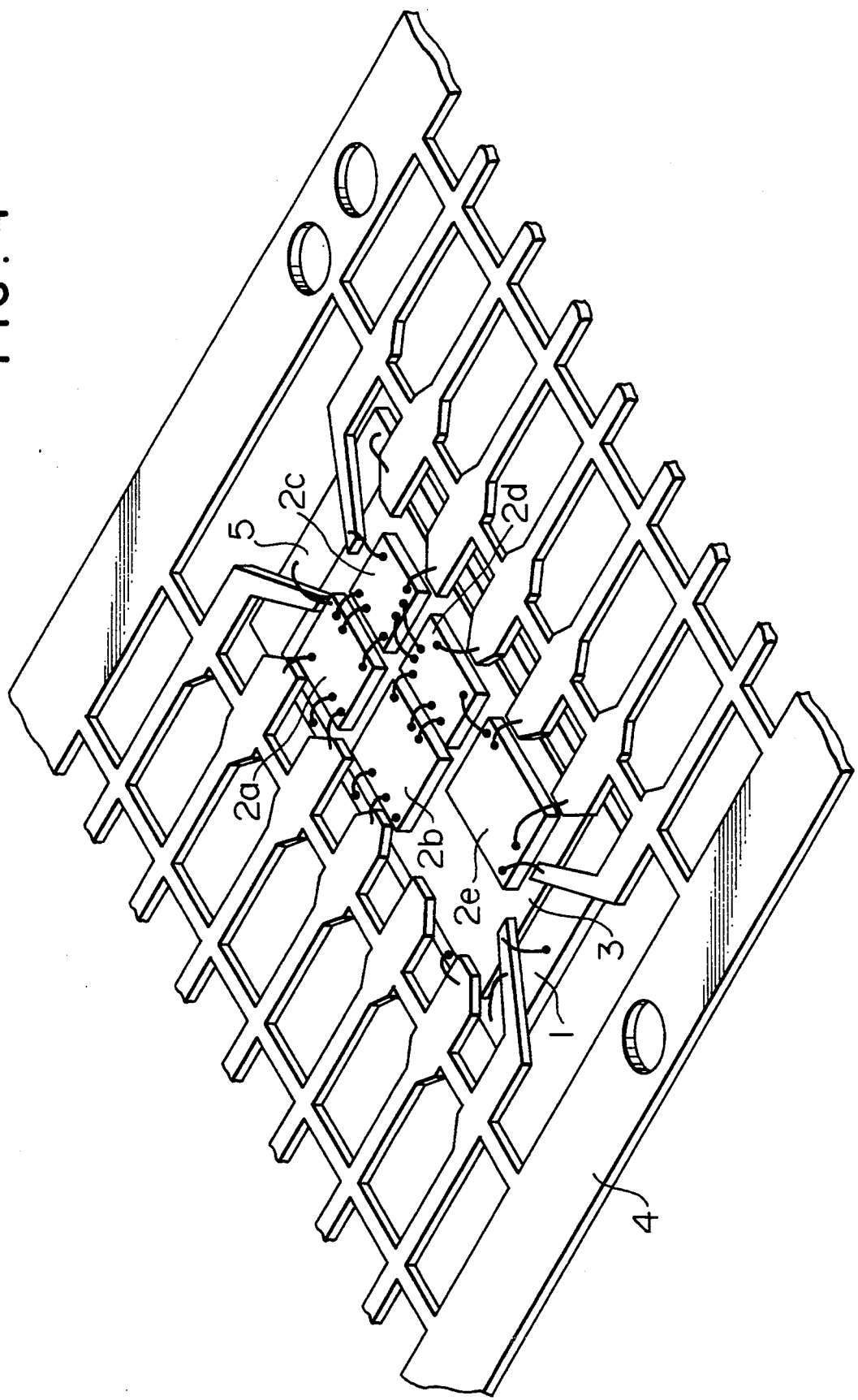
FIG. 4 is a perspective view of a semiconductor device according to a second embodiment of the present invention after a wire bonding operation is effected.

FIG. 4 shows a second embodiment of the present invention in the state immediately after a wire bonding step of a package production process. As in the first embodiment, after an insulating member 3 is placed on a chip 1 serving as a base, a plurality of small-size chips 2a to 2e, together with a lead frame 4, are mounted on the insulating member 3. Then, these components are electrically connected together by wires 5. In this embodiment, many small-size chips of a wide use type can be contained in the package, and therefore this construction is effective particularly for a multi-function driver package.

Figure 5:
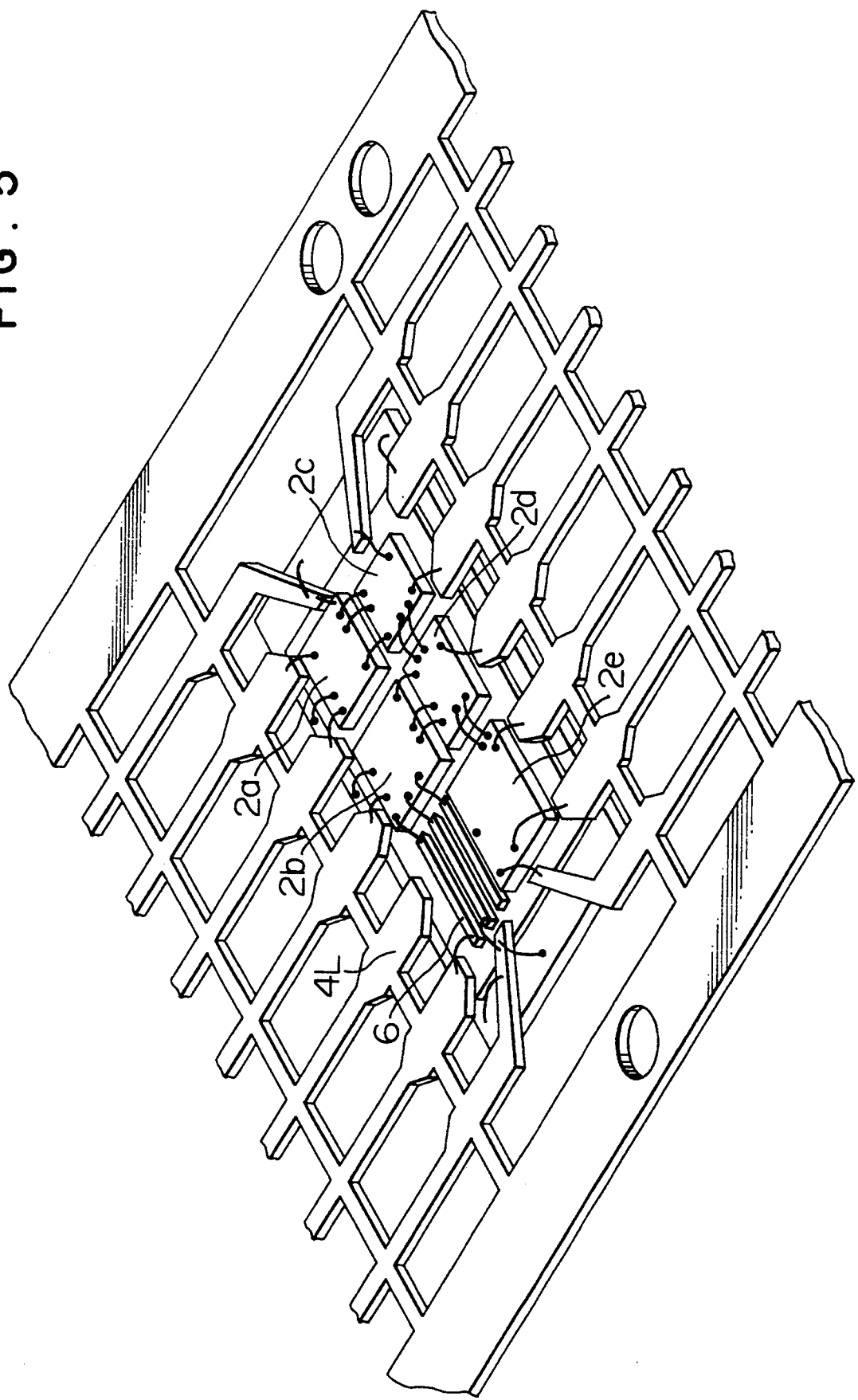
FIG. 5 is a perspective view of a semiconductor device according to a third embodiment of the present invention after a wire bonding operation is effected.

FIG. 5 shows a third embodiment of the present invention in the state immediately after a wire bonding step of a package production process. Chips and other parts mounted are similar to those in the second embodiment. For example, a conductor pattern 6 is formed on that portion of a surface of an insulating member 3 which is not occupied by chips 2a to 2e. With this arrangement, the chip and leads 4L remotely spaced from each other, as well as the chips remotely spaced from each other, can be electrically connected together with ease.

Figure 6:
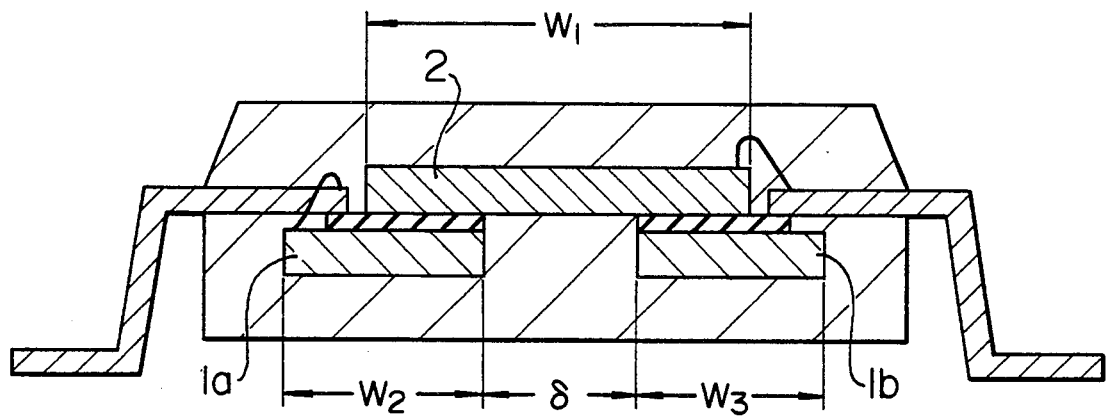
FIG. 6 is a vertical cross-sectional view of a semiconductor device according to a fourth embodiment of the present invention after a molding is effected.

FIG. 6 is a cross-sectional view taken in a direction of the width of a package according to a fourth embodiment of the invention. In the present invention, a plurality of chips 1a and 1b may be suitably positioned so as to constitute a base, and this embodiment is advantageous particularly when the dimensions of the chips are as represented by $W_1 \leq W_2 + W_3$ in FIG. 6. And besides, by changing the value of $\delta$, a required minimum exposed area in the vicinity of electrode pads of the chips 1a and 1b can be secured.

Figure 7:
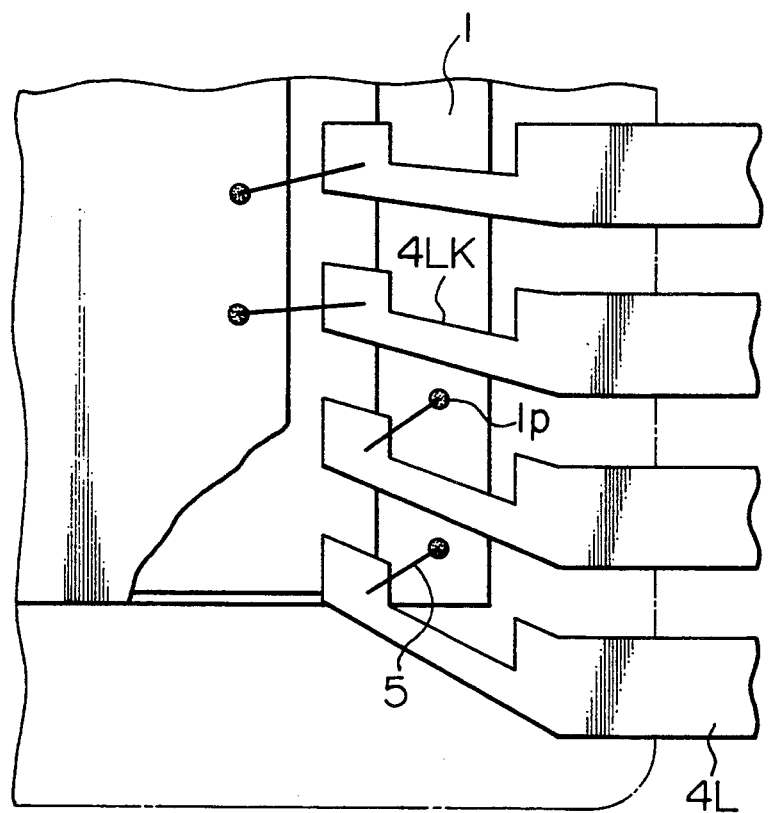
FIG. 7 is an enlarged plan view of an electrode pad portion of a semiconductor device according to a fifth embodiment of the present invention.

FIG. 7 shows a fifth embodiment of the present invention in the state immediately after a wire bonding step of a package production step. A notch 4LK, a slit, or a hole, is formed in an inner end portion of the lead 4L immediately adjacent to an electrode pad 1p of a chip 1 serving as a base. With this arrangement, the exposed area in the vicinity of this electrode pad is increased, and therefore when a wire 5 is to be connected to this electrode pad, a capillary is prevented from contacting with the lead.

As described above, according to the present invention, since the tab can be omitted from the lead frame, a plurality of chips can be contained in the package thinner than the conventional package. With this construction, for example, in the case of a large-capacity memory, its chip can be contained in the package in such a manner that this chip is divided into two sections, and therefore the width of the package can naturally be reduced.

According to the present invention, the electrical connection can be made through the intermediary of the conductor pattern provided on the insulating member, and therefore the remotely-spaced parts can be connected together, which increases the degree of freedom with respect to the arrangement of the small-size chip parts.

Further, according to the present invention, by providing the notch in the inner end portion of the lead, the exposed area in the vicinity of the electrode pad of the chip serving as the base is increased, and therefore there can be avoided the disadvantage that at the time of the wire bonding of the chip serving as the base, the capillary is contacted with the lead.

According to the present invention, the tab can be omitted from the lead frame, and therefore the amount of lamination of the semiconductor chips is increased by an amount corresponding to the thickness of the tab, thereby preventing the width of the semiconductor device from being increased. With this arrangement, the interchangeability with the conventional semiconductor device can be obtained.

Further, since the electrode pads are directed in the same direction, and are all exposed to the circuit formation surface, the electrical connections of the semiconductor chips can be carried out by the wire bonding from one direction. Therefore, the step of inverting the lead frame is not needed, and the production process is simplified, and also the reliability of the semiconductor chips as well as the reliability of the wires is enhanced.

Further, the notch, formed in the inner end portion of the lead in the vicinity of the electrode pad, increases the space in the vicinity of the electrode pad of the lower semiconductor chip, and this enhances the efficiency of the wire bonding.

What is claimed is:

1. A plastic-molded-type semiconductor device including a plurality of semiconductor chips each having a circuit formed surface, metallic wires connected to electrode pads of said semiconductor chips, leads connected to said metallic wires, and only an insulating film interposed, without a tab, between said semiconductor chips and sealed in a resin member such that said insulating film is disposed on a circuit formed surface of one of said semiconductor chips which serves as a base with the other of said semiconductor chips being mounted on said base through said insulating film with said circuit formed surface of each of said other semiconductor chips facing away from said insulating film such that said circuit formed surfaces of said one and said other of the semiconductor chips are directed in the same direction; end portions of said leads being bonded to a surface of said insulating film such that said end portions of the leads and said other of said semiconductor chips are disposed in a common plane on the surface of the insulating film member; and wherein all electrode pads of said semiconductor chips connected to said metallic wires are exposed to the circuit formed surface thereof.

2. A plastic-molded-type semiconductor device according to claim 1, wherein a notch is formed in an end portion of said lead close to said semiconductor chips, and is disposed in the vicinity of said electrode pad.

3. A plastic-molded-type semiconductor device according to claim 1, wherein a conductor pattern interconnecting a metallic wires and said leads is formed on a surface of a insulating film.

4. A plastic-molded-type semiconductor device according to claim 1, wherein said plurality of semiconductor chips are connected to one another by the metallic wires.

5. A plastic-molded-type semiconductor device according to claim 1, wherein said other of the plurality of semiconductor chips includes semiconductor chips that are different in main function from one another and are mounted by way of the insulating film on the one semiconductor chip serving as a base.

6. A plastic-molded-type semiconductor device including a plurality of semiconductor chips each having a circuit formed surface, metallic wires connected to electrode pads of said semiconductor chips, leads connected to said metallic wires, and only an insulating film interposed, without a tab, between said semiconductor chips and sealed in a resin member such that said insulating film is disposed on circuit forming surfaces of at least two of said semiconductor chips which serve as a base with the other of said semiconductor chips being mounted on said base through said insulating film with said circuit formed surface of each of said other of said semiconductor chips facing away from said insulating film such that said circuit formed surfaces of said at least two and said other semiconductor chips are directed in the same direction; end portions of said leads being bonded to a surface of said insulating film such that said end portions of the leads and said other of said semiconductor chips are disposed in a common plane on the surface of the insulating film; and wherein all electrode pads of said semiconductor chips connected to said metallic wires are exposed to the circuit formed surface thereof.

7. A plastic-molded-type semiconductor device according to claim 6, wherein a notch is formed in an end portion of a lead close to said semiconductor chips, and is disposed in the vicinity of an electrode pad.

8. A plastic-molded-type semiconductor device according to claim 6, wherein a conductor pattern interconnecting said metallic wires and said leads is formed on a surface of said insulating film.

9. A plastic-molded-type semiconductor device according to claim 6, wherein said plurality of semiconductor chips are connected to one another by the metallic wires.

10. A plastic-molded-type semiconductor device according to claim 6, wherein said other of the plurality of semiconductor chips includes semiconductor chips that are different in main function from one another and are mounted by way of the insulating film on the semiconductor chips serving as the base.

* * * * *